United States Patent [19]

Nakamura

[11] Patent Number: 5,739,574
[45] Date of Patent: Apr. 14, 1998

[54] SOI SEMICONDUCTOR DEVICE WITH LOW CONCENTRATION OF ELECTRIC FIELD AROUND THE MESA TYPE SILICON

[75] Inventor: Kazuyo Nakamura, Kitakatsuragi-gun, Japan

[73] Assignee: Sharp Kabushiki Kaisha, Osaka, Japan

[21] Appl. No.: 459,163

[22] Filed: Jun. 2, 1995

[30] Foreign Application Priority Data

Dec. 19, 1994 [JP] Japan ................................ 6-314896

[51] Int. Cl.⁶ .......................... H01L 27/01; H01L 29/76; H01L 29/06; H01L 21/265
[52] U.S. Cl. ........................ 257/401; 257/353; 257/354; 257/401; 257/406; 257/411; 257/618; 257/623; 438/29; 438/34
[58] Field of Search .................... 257/618, 623, 257/401, 406, 411, 353, 354; 437/29, 34

[56] References Cited

U.S. PATENT DOCUMENTS

| | | | |
|---|---|---|---|
| 3,690,968 | 9/1972 | Fa et al. | 257/411 |
| 3,974,515 | 8/1976 | Ipri et al. | 257/353 |
| 4,729,006 | 3/1988 | Dally et al. | 357/42 |
| 4,983,535 | 1/1991 | Blanchard | 437/29 |
| 5,060,035 | 10/1991 | Nishimura et al. | 257/903 |
| 5,340,999 | 8/1994 | Takeda et al. | 257/411 |
| 5,381,029 | 1/1995 | Eguchi et al. | 257/354 |

FOREIGN PATENT DOCUMENTS

| | | | |
|---|---|---|---|
| 0108251 | 5/1984 | European Pat. Off. | 437/29 |
| 2902665 | 8/1980 | Germany | 437/29 |
| 3808579 | 10/1988 | Germany | 437/29 |
| 62-291057 | 12/1987 | Japan . | |

*Primary Examiner*—Mahshid D. Saadat
*Assistant Examiner*—Ida Marie Soward
*Attorney, Agent, or Firm*—Nixon & Vanderhye P.C.

[57] ABSTRACT

A semiconductor device which includes a mesa type silicon film with a source/drain region and a channel region formed therein, a gate oxide film formed on the mesa type silicon film, and a gate electrode provided on the mesa type silicon film through the gate oxide film, wherein an oxide film having a thickness greater than that of the gate film is formed at the top edge section of the mesa type silicon which is present under the gate electrode, as well as a method for manufacturing it.

7 Claims, 15 Drawing Sheets

SOI SEMICONDUCTOR DEVICE WITH LOW CONCENTRATION OF ELECTRIC FIELD AROUND THE MESA TYPE SILICON

BACKGROUND OF THE INVENTION

1. Field of the Invention

The present invention relates to a semiconductor device and a method for manufacturing it, and more particularly to a semiconductor device with a mesa structure which is formed on a SOI (Silicon On insulator) substrate and serves to lower concentration of electric fields around mesa type silicon, as well as to a method for manufacturing

2. Description of the Related Art

Element isolation is one of the important techniques which determine the performance of devices manufactured with substrates having a SOI construction. Element isolation may be accomplished by methods which may be roughly classified into two groups. One group of methods accomplish element isolation by selective oxidation such as LOGOS, whereas the other group of methods relies on physical isolation between islands (mesas) by etching the top silicon to create islands (mesa structures).

Element isolation using a LOCOS film is usually performed as described below.

As shown in FIG. 35, used as the substrate is an SOl substrate 50 which comprises a buried oxide film 52 and a top silicon layer 53 formed on a silicon substrate 51. A thin oxide film (not shown in the figure) and a SiN film 54 are overlaid on the SOl substrate 50 in succession. Then, the part of the SiN film 54 which is located in the region 55 intended as an element isolation region is removed by photolithography and anisotropic dry etching. Subsequently, LOCOS oxidation is carried out to form a LOCOS film 56. Here, in order to establish complete electrical insulation, desirably the entire part of the top silicon layer 53 in the region intended as an element isolation region is oxidized to bring the LOCOS film 56 into contact with the buried oxide film 52, as shown in FIGS. 36 and 37.

Thereafter, as shown in FIG. 38, the SiN film 54 is removed completely. Then, a gate oxide film (not shown in the figure) and polysilicon 57 intended for gate electrodes are layered on the LOCOS film 56 and the separated top silicon layer 53a.

In cases where element isolation is performed with a LOCOS film in this way, use of a SOI substrate with a top silicon layer, especially one having a small film thickness, raises the following problem. That is, at the moment the LOCOS film is brought into contact with the buried oxide film in the SOl substrate as the result of progress of the LOCOS oxidation, the oxygen penetrating through the buried oxide film in a circularizing manner as illustrated by the arrow in FIG. 37 oxidizes the top silicon layer from its bottom side to thin the top silicon layer.

Since the characteristics of SOI construction-based transistors vary drastically depending on the film thickness of the top silicon, the aforementioned thinning of the top silicon is a critical flaw from the point of view of device characteristics. The thinning is particularly severe in cases where the top silicon layer has a small film thickness.

An explanation will now be given regarding a method for element isolation based on mesa structures.

The same type of SOI substrate 60 as that used above is employed. First, photolithography and anisotropic dry etching are conducted to remove the part of the top silicon layer 63 of the SOI substrate 60 which is located in the region intended as an element isolation region. This removal causes exposure of a buried oxide film 62 in the region intended as an element isolation region and forms a physically separated mesa type silicon 63a; this mesa type silicon layer is also isolated electrically from the neighboring mesa type silicon. Subsequently, as shown in FIG. 39, a thin oxide film (not shown in the figure) is formed on the SOl substrate 60, after which a gate electrode 64 is formed on the SOl substrate 60 comprising the mesa type silicon 63a.

In this case, since the extent of oxidation while the buried oxide film 62 is exposed is extremely small (only the thin oxide film portion corresponding to the gate oxide film is oxidized), there is no such problem of thinning the top silicon layer due to circularizing penetration of oxygen as described above, but instead, the following problem is presented. That is, as shown in FIG. 40 which is an enlarged view of the Y portion in FIG. 39, not only the top surface but also the side face of the top corner edge section of the mesa type silicon layer 63a is covered with the gate electrode 64. As a result, upon application of an operation-on potential to the gate electrode, electric fields are applied to the top surface of the top corner edge section of the mesa type silicon 63a from two directions. This triggers earlier change (formation of a channel) of the top corner edge section of the mesa type silicon 63a than the other sections, and eventually the on/off characteristics of the transistor is impaired as evidenced by a kink of the gate voltage-drive current curve which is illustrated by K in FIG. 41.

As a solution to such a problem, for example, there has been presented a semiconductor device which allows attenuation of the electric field applied through the sidewall as illustrated in FIG. 46, by formation of an oxide film 75 along only the side surface of the mesa type silicon 73a, as shown in This type semiconductor device may be formed in the manner described below.

As shown in FIG. 42, a SOI substrate 70 is used which comprises a buried oxide film 72 and a top silicon layer 73 formed on a silicon substrate 71. A thin oxide film (not shown in the figure) and a SiN film 74 are layered on this SOI substrate 70. Then, the part of the SiN film 74 and the part of the top silicon layer 73 in the region 77 intended as an element isolation region are removed by photolithography and anisotropic dry etching to form a mesa type silicon layer 73a.

Then, as shown in FIG. 43, an oxide film 75 is formed along only the sidewall of the mesa type silicon layer 73a by exposing the side surface of the mesa type silicon layer 73a to an oxidizing atmosphere, with the SiN film 74 as the mask.

Thereafter, as shown in FIG. 44, the SiN film 74 is removed and a gate electrode 76 is formed on the SOI substrate 70 containing the mesa type silicon 73a.

This method, however, requires oxidation while the buried oxide film 72 is exposed, and therefore the problem of thinning the mesa type silicon 73a arises in the same manner as in the case of LOCOS oxidation described above.

in addition, since the above method fails to form an oxide film known as a "bird's beak" in the top corner edge section of the mesa type silicon 73a to a satisfactory extent (the bird's beak does not grow in appearance because of growth of the oxide film 75 along the sidewall of the mesa type silicon 73a in the same direction as the extension of the bird's beak), a later cleaning step, etc. causes gradual removal of the oxide films 72 and 75 over the entire SOI substrate 70, as shown in FIG. 47. As a result, in cases where a gate electrode 76 is formed on the SOI substrate 70 as illustrated in FIG. 48, upon application of an operation-on potential to the gate electrode, the on/off characteristics are impaired since the top corner edge section of the mesa type silicon layer 73a receive electric fields from two directions, as illustrated in FIG. 49.

SUMMARY OF THE INVENTION

The present invention has been accomplished to overcome the aforementioned problem, and is aimed at providing a semiconductor device which allows tower concentration of electric fields around mesa type silicon, as well as a method for manufacturing According to the invention, there is provided a semiconductor device which comprises a mesa type silicon film with source/drain regions and a channel region formed therein, a gate oxide film formed on the mesa type silicon film, and a gate electrode provided on the mesa type silicon film via the gate oxide film, wherein the top edge section of the mesa type silicon which is present under the gate electrode has an oxide film formed with a greater thickness than that of the gate oxide film.

Also, according to the invention, there is provided a method for manufacturing the aforementioned semiconductor device, characterized by comprising:

(i) forming at least an insulating layer and a top silicon layer on an SOI substrate in succession and processing the top silicon layer into a mesa type silicon film;

(ii) forming an oxidation-inhibiting film over the entire top surface of the SOI substrate comprising the mesa type silicon film and then removing the part of the oxidation-inhibiting film present on the top corner edge section of the mesa type silicon film;

(iii) subjecting the top edge section of the mesa type silicon film to oxidation is form a thicker oxide film thereon than the gate oxide film which will be formed later;

(iv) removing the residual oxidation-inhibiting film; and (v) forming a gate oxide film and a gate electrode on the SOI electrode comprising the mesa type silicon film.

The aforementioned method is further characterized in that:

in step (i), an additional first oxidation-inhibiting film is formed on the SOI substrate and both the first oxidation-inhibiting film and the top silicon film are processed into mesa type silicon films;

in step (ii), the step for the formation of the oxidation-inhibiting film over the entire top surface of the SOI substrate is accomplished by forming an additional second oxidation-inhibiting film over the entire top surface of the SOI substrate comprising the mesa type silicon film with the first oxidation-inhibiting film; and the step of removing the part of the oxidation-inhibiting film which is present on the top edge section of the mesa type silicon film is accomplished by forming a planarization film over the entire top surface of the second oxidation-inhibiting film, etching in the planarization film so that the planarization film is of almost the same height as the mesa type silicon film, and removing the first oxidation-inhibiting film and the second oxidation-inhibiting film which are present on the top edge section of the mesa type silicon film, with the residual planarization film as the mask.

Also, according to the invention, there is provided another method for manufacturing the aforementioned semiconductor device, characterized by comprising:

(i) forming an oxidation-inhibiting film with a desired pattern on a SOI substrate with an insulating layer and a top silicon layer formed thereon in succession;

(ii) subjecting the top silicon layer to LOCOS oxidation, with the oxidation-inhibiting film as the mask, to such an extent that the entire layer is not oxidized;

(iii) processing the top silicon layer into a mesa type silicon layer, with the oxidation-inhibiting film as the mask, to form a thicker oxide film on the top edge section of the mesa type silicon film than the gate oxide layer which will be formed later;

(iv) removing the residual oxidation-inhibiting film; and (v) forming a gate oxide film and a gate electrode on the SOI electrode comprising the mesa type silicon film.

In addition, the invention provides a modified version of the above-described semiconductor device which comprises a spacer formed along the sidewall of the mesa type silicon film.

According to the invention, there is provided a method for manufacturing the aforementioned spacer-provided semiconductor device, characterized by comprising:

(i) forming at least an insulating layer and a top silicon layer on a SOI substrate in succession and processing the top silicon layer into a mesa type silicon layer;

(ii) forming an oxidation-inhibiting film over the entire top surface of the SOI substrate comprising the mesa type silicon film and then removing the part of the oxidation-inhibiting film present on the top edge section of the mesa type silicon film;

(iii) subjecting the top edge section of the mesa type silicon film to oxidation to form a thicker oxide film thereon than the gate oxide film which is formed later;

(iv) removing the residual oxidation-inhibiting film;

(v) forming a spacer film over the entire SOI substrate;

(vi) etching back the spacer film by anisotropic dry etching to preserve the spacer along the sidewall of the mesa type silicon film; and (vii) forming a gate oxide film and a gate electrode on the SOI electrode comprising the mesa type silicon film.

Also, according to the invention, there is provided another method for manufacturing the aforementioned spacer-provided semiconductor device, characterized by comprising:

(i) forming an oxidation-inhibiting film with a desired pattern on a SOI substrate with an insulating layer and a top silicon layer formed thereon in succession;

(ii) subjecting the top silicon layer to LOGOS oxidation, with the oxidation-inhibiting film as the mask, to such an extent that the entire layer is not oxidized;

(iii) processing the top silicon layer into a mesa type silicon layer, with the oxidation-inhibiting film as the mask, to form a thicker oxide film on the top edge section of the mesa type silicon film than the gate oxide layer which will be formed later;

(iv) removing the residual oxidation-inhibiting film;

(v) forming a spacer film over the entire SOI substrate;

(vi) etching back the spacer film by anisotropic dry etching to preserve the spacer along the sidewall of the mesa type silicon film; and (vii) forming a gate oxide film and a gate electrode on the SOI electrode comprising the mesa type silicon film.

BRIEF DESCRIPTION OF THE DRAWINGS

Other and further objects, features, and advantages of the invention will be more explicit from the following detailed description taken with reference to the drawings wherein:

FIG. 25 is a second schematic flow diagram illustrative of the fifth embodiment of the method for manufacturing a semiconductor device of the invention;

DETAILED DESCRIPTION

Figure 1:
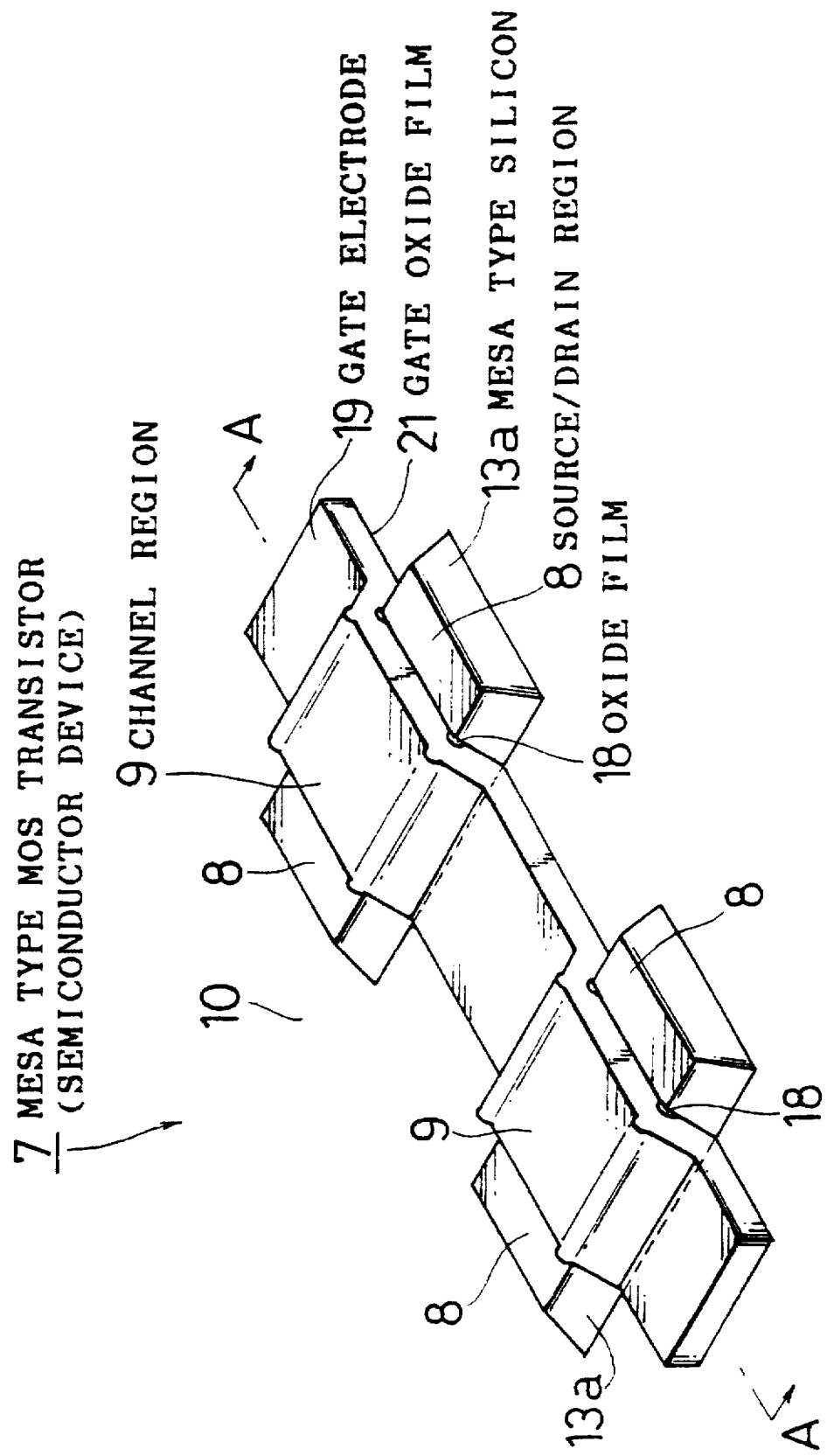
FIG. 1 is a schematic perspective view of the main portion of an embodiment of the semiconductor device of the present invention.

Semiconductor devices according to the present invention consist mainly of a mesa type silicon film, a gate oxide film and a gate electrode, wherein the top edge section of the mesa type silicon film, which is covered by the gate electrode, has an oxide film thicker than the gate oxide film. Such semiconductor devices may be manufactured by using substrates of a SOI, SOS (Silicon On Sapphire) or SIMOX (Separation by Implanted Oxygen). Such substrates are ones with an insulating layer and a top silicon layer formed on a base plate or ones with a top silicon layer formed on an insulated base plate. Concrete examples thereof include a substrate with a single-crystal insulating film of spinel, $Al_2O_3$,MgO, BP, $CaF_2$, SrO or the like and silicon formed on a silicon base plate, a substrate with silicon formed on an insulated base plate of sapphire or the like, a substrate with an insulating film of SiN, $SiO_2$ or the like and single-crystal silicon formed on a silicon base plate, a substrate with silicon formed on a buried oxide film which is formed by implanting $O^+$ ions into a silicon base plate or by chemical anodization of a silicon base plate, etc. In most cases, the insulating layer formed on a silicon plate has a film thickness on the order of 50–100 nm, and the top silicon layer formed on an insulating layer is approximately 10–500 nm in thickness, though these ranges are not restrictive.

The mesa type silicon film is formed as an island pattern by subjecting the top silicon layer of the substrate to a known method such as a combination of photolithography and etching, for example. The mesa type silicon film functions as the active region of a mesa type transistor formed with source/drain regions and a channel region. The source/drain regions may be formed by a known method, for example, by implantation of p-type or n-type impurities.

The gate oxide film formed on the mesa type silicon film preferably has a film thickness on the order of 3–100 nm and is formed by a known method such as thermal oxidation, for example.

The gate electrode may be formed from polysilicon, tungsten, titanium, nickel, cobalt, tantalum, aluminum or germanium, or a silicide, polycide, etc. of those metals. Preferably, the gate electrode is formed with a thickness on the order of 30–100 nm by a known method.

The oxide film must be formed on the top edge section of the mesa type silicon film at least to a sufficient extent to cover the part of the top edge section which is covered with the gate electrode (at least the part immediately below the gate electrode), preferably with a maximum film thickness on the order of 5–300 nm for the thickest section. Of course, this thickness may be adjusted appropriately depending on the supply voltage and the film thickness of the gate oxide film.

In addition, a spacer of SiO2, SiN or the like may be formed between the oxide film provided on the top edge section of the mesa type silicon film which has a greater thickness than the gate oxide film, and the substrate surface: that is, along the sidewall of the mesa type silicon film covered with the gate electrode. This spacer may be constructed by forming an oxide film on the top edge section of the mesa type silicon film, forming a film of $SiO_2$, SiN or the like to a thickness on the order of 10–500 nm over the entire top surface of the substrate and then etching back the entire surface by anisotropic etching or the like.

According to a method for manufacturing semiconductor devices of the invention, a mesa type silicon film is formed, and then an oxidation-inhibiting film is formed on the entire top surface of the substrate, after which the part of the oxidation-inhibiting film is removed which is located on the top edge section of the mesa type silicon film. Here, the oxidation-inhibiting film is not limited to any particular one, though preferably a SiN film is used. Desirably, the oxidation-inhibiting film is formed to a thickness on the order of 20–200 nm by a known method. Removal of the oxidation-inhibiting film located on the top edge section of the mesa type silicon film is preferably carried out by anisotropic dry etching with a great sputtering effect under conditions set so as to etch off only angular configurations, but not even surfaces. For example, $C_3F_8$, $C_4F_8$ or another member of the C-F family of gases may be used as the gas, and the flow rate may be adjusted appropriately with a system designed therefor. The conditions include a pressure of a mTorr, a source power of 2,000–3,000 W and a bias power of 500–700 W. Further, in cases where a first oxidation-inhibiting film is formed on the top silicon layer, and the mesa type silicon is patterned, the first oxidation-inhibiting film may be patterned together with it. In this case, however, a second oxidation-inhibiting film is formed over the entire top surface of the mesa type silicon and the first oxidation-inhibiting film, and a planarization film is formed on the entire top surface of the second oxidation-inhibiting film. The aforementioned types of oxidation-inhibiting film may be used as the first and second oxidation-inhibiting films. Here, preferably the film thickness of the first oxidation-inhibiting film is on the order of 10–500 nm, and second oxidation-inhibiting film has a film thickness on the order of 5–500 nm. The planarization film is not limited to any particular one, but preferably SOG, BPSG, PSG or the like is layered as the planarization film to a film thickness on the order of 20 nm–2 μm. Thereafter, the planarization film is etched off to such an extent that has almost the same height as the mesa type silicon film. This etching may be performed by a known method: for example, $CF_4$ is introduced into a reaction chamber with high-temperature sections, e.g., the upper electrode, chamber wall, etc., at 200° C. or more, while controlling the flow rate to a few mTorr under the conditions: source power, 1,500–2,500 W; bias power, 400–600 W. The first and second oxidation-inhibiting films are etched off using the resulting planarization film as the mask. Preferably the etching is carried out under such anisotropic etching conditions that allow removal of the non-masked second oxidation-inhibiting film and the part of the first oxidation-inhibiting film which is located on the top edge section of the mesa type silicon film, to expose only the top edge section of the mesa type silicon film. Specifically, the etching may be accomplished while controlling the pressure of $CF_4$ and $O_2$ to a few Torr (e.g., 2 torr), the volume of $O_2$ to 40% or more of the total flow, and the bias power to 200–300 W.

Oxidation treatment is applied to the mesa type silicon film obtained in this way from which the oxidation-inhibiting film on the top edge section thereof has been removed. Preferably, this oxidation treatment is carried out under conditions which allow production of an approximately 5–500) nm-thick oxide film on a even silicon wafer at a temperature in the range of approximately 700–1,200° C., for example. These conditions allow formation of an oxide film on the top edge section of the mesa type silicon film which has a greater film thickness than the gate oxide film which is formed in a later step; for example, one with a film thickness twice or more that of the gate oxide film at its thickest section (corner section).

The above-described formation of the oxide film is followed by a known method including steps of controlling the threshold voltage, forming a gate oxide film, and forming a gate electrode and forming source/drain regions, and other steps, nnder appropriate, desired conditions, to manufacture semiconductor devices.

Separately, another method for manufacturing semiconductor devices of the invention may include formation of an oxidation-inhibiting film of a desired shape on a SOI substrate, LOGOS oxidation relying on the oxidation-inhibiting film and subsequent formation of a mesa type silicon film. First, an oxidation-inhibiting film is formed on a SOI substrate, and then an opening is formed in the region for forming an element isolation film by a known method, such as a combination of photolithography and etching. The resulting SOI substrate is then subjected to LOGOS oxidation by a known method. Preferred conditions for this LOCOS oxidation are such that an even silicon wafer is oxidized to provide an oxide film with a thickness on the order of 5–500 nm at a temperature in the range of approximately 700–1,200° C. In other words, during this oxidation the top silicon layer in the region for forming an element isolation film is oxidized; however, its depth direction is not completely oxidized so as not to completely divide the element-forming region. Specifically, the top silicon layer is oxidized on the order of 10–90% with respect to its film thickness. Here, the oxidation may be controlled appropriately depending on the variation in the gate oxide film, the power voltage, the shape of the top silicon layer, etc. Thereafter, the LOCOS film and the residual top silicon layer are removed by means of the oxidation-inhibiting film used for the LOCOS oxidation, by a known method, for example anisotropic etching, until the insulating layer lying under the top silicon layer is exposed. This removal results in formation of a mesa type silicon layer with an oxide film thicker than the gate oxide film which will be formed later.

Since the semiconductor devices according to the invention are designed in such a manner that a thicker oxide film than a gate oxide film is formed on the top edge section of a mesa type silicon layer, the gate-channel capacity at the top edge section of the mesa type silicon film which is produced upon application of a voltage across the gate electrode may be made smaller, and concentration of electric fields on the channel region in the mesa type silicon film from two directions may be lowered, and as a result, the on/off characteristics of the semiconductor device may be improved.

Also, according to a method for manufacturing semiconductor devices according to the invention, since the thicker oxide film than the gate oxide film is formed on the top edge section of the mesa type silicon film by forming the oxidation-inhibiting film over the entire top surface of the substrate with the mesa type silicon firm, removing the oxidation-inhibiting film located on the top edge section of the mesa type silicon film and conducting the oxidation treatment with the resulting oxidation-inhibiting film as the mask, the insulating layer of the SOI substrate is protected against the oxidizing atmosphere during the oxidation treatment. Consequently, this results in avoiding thinning of the top silicon due to circularizing penetration of oxygen through the insulating layer during the oxidation treatment as observed with the prior art element isolation method relying on LOCOS oxidation.

In addition, in cases where an oxidation-inhibiting film of a desired shape is formed on a SOl substrate, and a mesa type silicon film is formed after LOGOS oxidation which utilizes the oxidation-inhibiting film, a bird's beak with a significant film thickness is formed on the top edge section of the mesa type silicon film, and as a result, exposure of the top edge section of the mesa type silicon film may be avoided even if the film thickness of the oxide film formed on the substrate is reduced in the cleaning step, etc. of the method. Thus, the manufacturing method is free from fewer restrictions and has greater flexibility.

DETAILED DESCRIPTION OF THE PREFERRED EMBODIMENTS

Now referring to the drawings, preferred embodiments of the invention are described below.

A mesa type MOS transistor which is a semiconductor device of the invention and embodiments of the method for manufacturing it will now be explained with reference to the drawings.

Example 1

Figure 12:
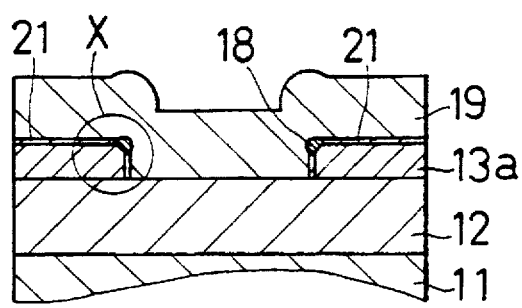
FIG. 12 is a ninth schematic flow diagram illustrative of the first embodiment of the method for manufacturing a semiconductor device of the invention.

As shown in FIG. 1 and FIG. 12 which is a cross sectional view taken on the line A—A in FIG. 1, a mesa type MOS transistor 7 is constructed with a gate electrode 19 provided on a mesa type silicon 13a which constitutes a SOI substrate 10, through a gate oxide film 21. The mesa type silicon 13a comprises a channel region 9 placed immediately below the gate electrode 19 and source/drain regions 8 abutting the channel region 9. The top edge section of the mesa type silicon 13a (the portion on which electric fields of the gate electrode 19 are concentrated when a voltage is applied across the gate electrode 19) has an oxide film 18 thicker than the gate oxide film 21.

Figure 2:
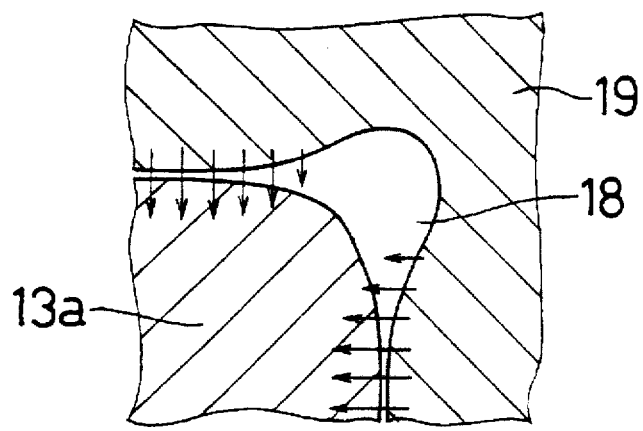
FIG. 2 is a schematic section view illustrative of concentration of electric fields on the top edge section of the mesa type silicon film of a semiconductor device of the invention.
Figure 3:
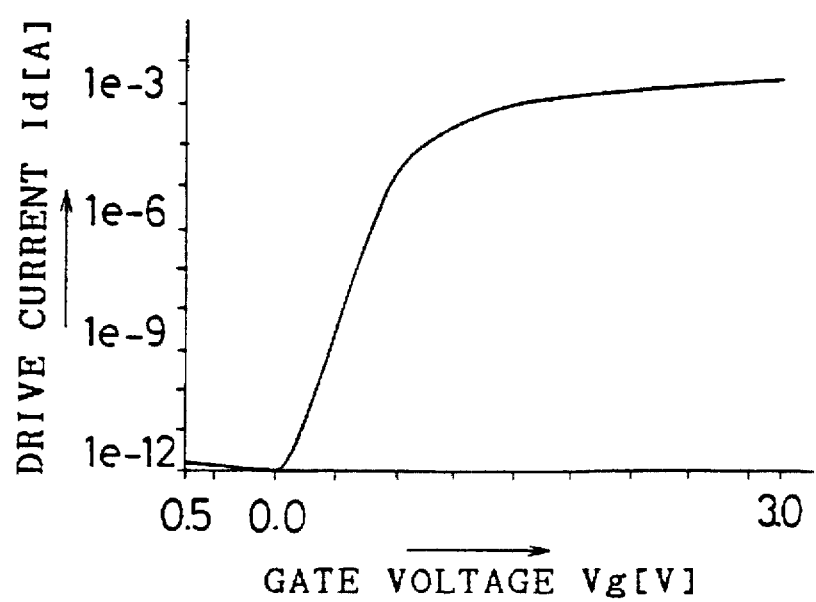
FIG. 3 is a graph showing the drive current-gate voltage characteristics of a semiconductor device of the invention.

With the mesa type MOS transistor 7 constructed in this way, as shown in FIG. 2 which is an enlarged view of the X section in FIG. 12, even when an operation-on potential is applied to the gate electrode 19, the oxide film 18 may moderate the gate-channel capacity to lower concentration of electric fields on the channel region of the mesa type silicon 13a in two directions toward the top surface and the side surface. This improves the on/off characteristics of the transistor as evidenced by the gate voltage-drive current curve shown in FIG. 3.

A method for manufacturing the mesa type MOS transistor will now be explained.

Figure 4:
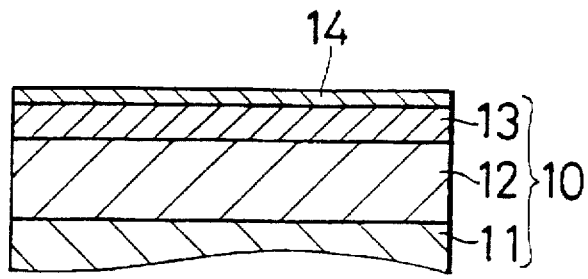
FIG. 4 is a first schematic flow diagram illustrative of a first embodiment of the method for manufacturing a semiconductor device of the invention.

A SOI substrate 10 is used which comprises a buried oxide film 12 and with a film thickness on the order of 200 nm a top silicon layer 13 with a film thickness on the order of 100 nm formed on a silicon plate 11. As shown in FIG. 4 on the top silicon layer 13 of the SOl substrate 10 are overlaid an oxide film with a film thickness on the order of 5 nm (not shown in the figure) and a SiN film 14 with a film thickness on the order of 60 nm.

Figure 5:
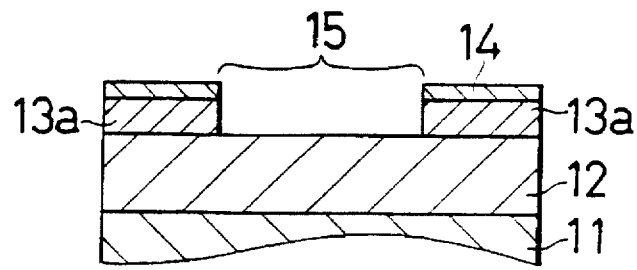
FIG. 5 is a second schematic flow diagram illustrative of the first embodiment of the method for manufacturing a semiconductor device of the invention.

Then, as shown in FIG. 5, all the parts of the SiN film 14, the oxide film and the top silicon layer 13 which are located in the region 15 which will be later converted into an element isolation region, are removed by photolithography and isotropic dry etching to expose a buried oxide film 12 in the region 15 and to form the mesa type silicon 13a.

Figure 6:
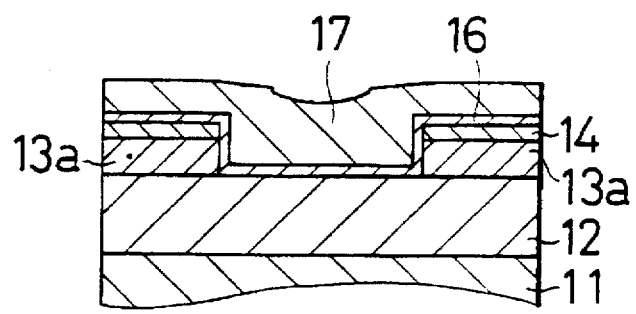
FIG. 6 is a third schematic flow diagram illustrative of the first embodiment of the method for manufacturing a semiconductor device of the invention.

Further, as shown in FIG. 6, a SiN film 16 is overlaid on the entire top surface of the SOI substrate 10 to a thickness on the order of 40 nm, thus covering the SiN film 14 and the exposed buried oxide film 12 with the SiN film 16. Then, planarization is accomplished by laying a SOG film 17 with excellent planarization performance on the SiN film 16.

Figure 7:
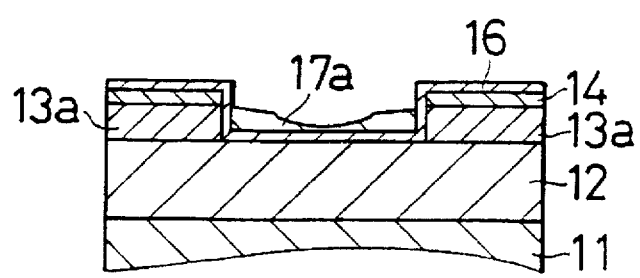
FIG. 7 is a fourth schematic flow diagram illustrative of the first embodiment of the method for manufacturing a semiconductor device of the invention.

Thereafter, as shown in FIG. 7, the entire top surface of the SOG film 17 is etched back to such a depth that the top surface of the film 17 is located at the same level as the top surface of the mesa type silicon 13a.

Figure 8:
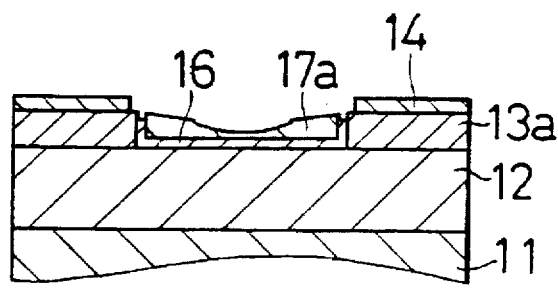
FIG. 8 is a fifth schematic flow diagram illustrative of the first embodiment of the method for manufacturing a semiconductor device of the invention.

Then, as shown in FIG. 8, the SiN film 16 is etched off with the residual SOG film 17a as the mask. Here, the etching is carried out under conditions set so that the SiN is etched off by approximately 50 nm in thickness by isotropic dry etching. These procedures leave intact most of the SiN film 14 overlaid on the mesa type silicon 13a, and expose silicon only at the top edge section of the mesa type silicon 13a (the section where electric fields of the gate electrode are concentrated which electrode is formed in a later step).

Figure 9:
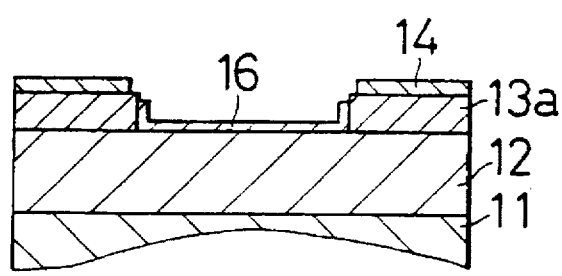
FIG. 9 is a sixth schematic flow diagram illustrative of the first embodiment of the method for manufacturing a semiconductor device of the invention.

Subsequently, as shown in FIG. 9, the residual SOG film 17a is removed completely.

Figure 10:
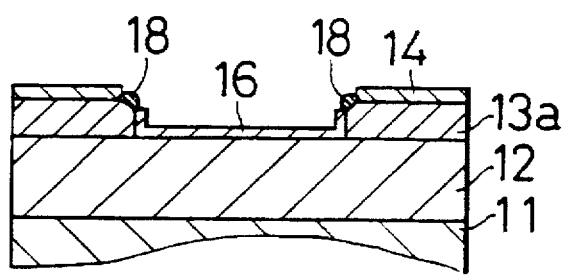
FIG. 10 is a seventh schematic flow diagram illustrative of the first embodiment of the method for manufacturing a semiconductor device of the invention.

Then, as shown in FIG. 10, the top edge section of the mesa type silicon 13a is provided with an oxide film 18 which has a maximum thickness of approximately 70 nm at its thickest section, under conditions which allow production of an oxide film with a thickness on the order of 100 nm on an even, bare silicon wafer by pyrogenic oxidation at around 900° C.

Figure 11:
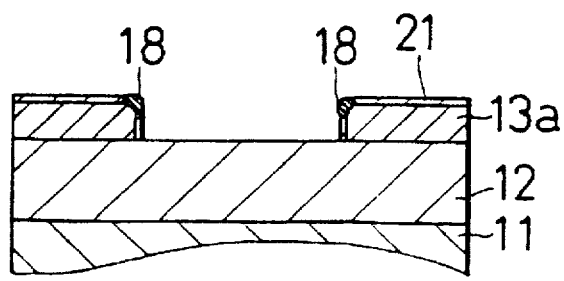
FIG. 11 is an eighth schematic flow diagram illustrative of the first embodiment of the method for manufacturing a semiconductor device of the invention.

Then, as shown in FIG. 11, phosphoric acid heated to approximately 150° C. is used to remove the SiN films 14, 16 remaining on the mesa type silicon 13a and the buried oxide film 12.

Subsequently, ion implantation is conducted to control the impurity concentration of the mesa type silicon 13a and the SOI substrate 10. Thereafter, as shown in FIG. 11, a gate oxide film 21 with a film thickness on the order of 8 nm is formed on the entire top surface of the SOI substrate 10 comprising the mesa type silicon 13a with the oxide film 18, and polysilicon 19 is overlaid on the film 21 for formation of a gate electrode (FIG. 12).

Then, the method follows conventional steps for ion implantation, thermal processing, etc., to manufacture a mesa type silicon transistor 7 as shown in FIG. 1.

EXAMPLE 2

In the same manner as in Example 1, an oxide film 18 is formed on the top edge section of a mesa type silicon 13a, as shown in FIG. 4 through FIG. 11.

Figure 13:
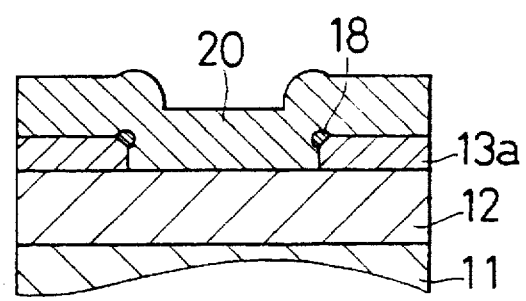
FIG. 13 is a schematic flow diagram illustrative of a second embodiment of the method for manufacturing a semiconductor device of the invention.

Then, as shown in FIG. 13, a SiN film 20 with a film thickness on the order of 100 nm is formed on the entire top surface of a SOI substrate 10 comprising the mesa type silicon 13a with the oxide film 18.

Figure 14:
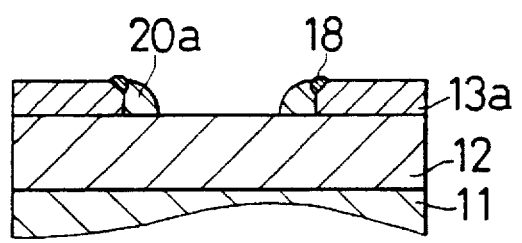
FIG. 14 is another schematic flow diagram illustrative of the second embodiment of the method for manufacturing a semiconductor device of the invention.

Subsequently, as shown in FIG. 14, by etching back the SiN film 20 by anisotropic dry etching there is formed a SiN spacer 20a on the section between the levels (steps) of the oxide film 18 formed on the top edge section of the mesa type silicon 13a and the top surface of the buried oxide film 12, that is, the sidewall of the mesa type silicon 13a. This formation may lessen the difference in level between the oxide film 18 and the buried oxide film 12, and allows elimination of difficulties encountered in processing of the gate electrode which are caused by the difference in level.

Figure 15:
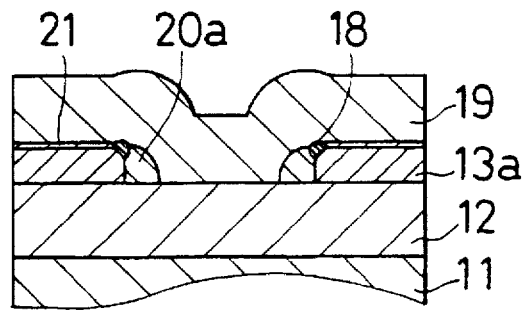
FIG. 15 is an additional schematic flow diagram illustrative of the second embodiment of the method for manufacturing a semiconductor device of the invention.

Thereafter, as shown in FIG. 15, a gate oxide film 2t is formed on the entire top surface of the SOI substrate 10 comprising the mesa type silicon 13a with the oxide film 18 and the spacer 20a, and polysilicon 19 is overlaid on the film 21 for formation of a gate electrode.

EXAMPLE 3

Figure 16:
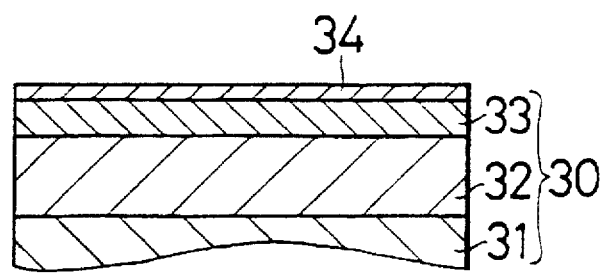
FIG. 16 is a first schematic flow diagram illustrative of a third embodiment of the method for manufacturing a semiconductor device of the invention.
Figure 17:
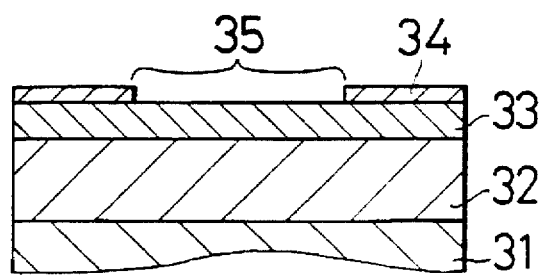
FIG. 17 is a second schematic flow diagram illustrative of the third embodiment of the method for manufacturing a semiconductor device of the invention.

A SOI substrate 30 is used, which comprises a buried oxide film 32 with a film thickness on the order of 200 nm and a top silicon layer 33 with a thickness on the order of 100 nm formed on a silicon plate 31. As shown in FIG. 16, on the top silicon layer 33 of the SOI substrate 10 are overlaid an oxide film with a film thickness on the order of 5 nm (not shown in the figure) and a SiN film 34 with a film on the order of 60 nm. e Then, as shown in FIG. 17, only the part of the SiN film 34 in the region 35 which will be later converted into an element isolation region, is removed by photolithography and anisotropic dry etching to expose the top silicon layer 33 in the region 35.

Figure 18:
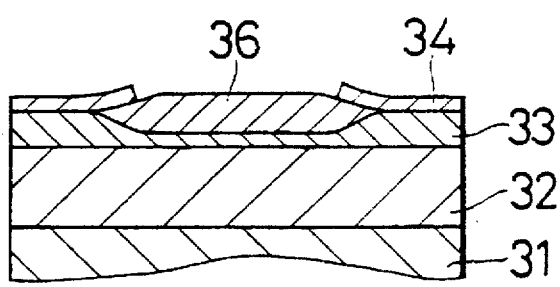
FIG. 18 is a third schematic flow diagram illustrative of the third embodiment of the method for manufacturing a semiconductor device of the invention.

Thereafter, as shown in FIG. 18, LOCOS oxidation is carried out to such an extent that only a slight height of the top silicon layer 33 is left in its depth direction in the region 35 intended as an element isolation region (oxidation is not done across the entire film thickness). The oxidation conditions are, for example, such that they allow production of an oxide film with a thickness on the order of 100 nm on an even, bare silicon wafer by pyrogenic oxidation at around 900° C., and an oxide film 36 is obtained in the region 35 intended as an element isolation region, leaving the non-oxidized section of the top silicon layer 33 with a minimum film thickness on the order of 50 nm. At this stage, the element region is still integrated by the non-oxidized thin section of the top silicon layer 33; sufficient element isolation has not been established.

Figure 19:
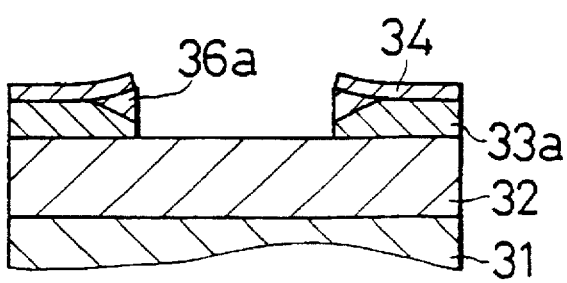
FIG. 19 is a fourth schematic flow diagram illustrative of the third embodiment of the method for manufacturing a semiconductor device of the invention.

Then, as shown in FIG. 19, anisotropic dry etching is carried out with the residual SiN film 24 as the mask, successively remove the part of the oxide film 36 (the film which has underwent LOGOS oxidation to a depth of 100 nm) in the region 35 intended as an element isolation region and the part of the top silicon layer 33 (a 50 nm-thick residual silicon) remaining thereunder. This successive removal accomplishes complete separation of the element region and forms a mesa type silicon 33a with the oxide film 36a on its top edge section.

Figure 20:
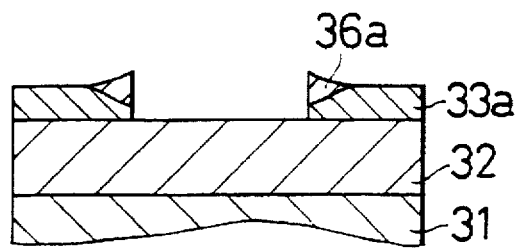
FIG. 20 is a fifth schematic flow diagram illustrative of the third embodiment of the method for manufacturing a semiconductor device of the invention.
Figure 21:
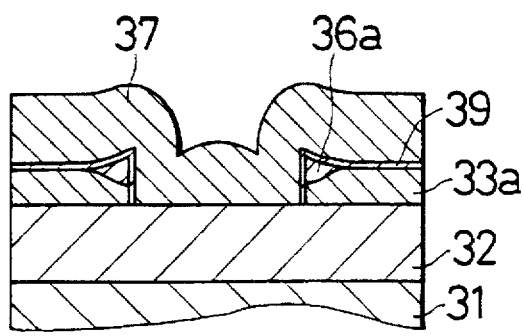
FIG. 21 is a sixth schematic flow diagram illustrative of the third embodiment of the method for manufacturing a semiconductor device of the invention.

Then, as shown in FIG. 20, phosphoric acid heated to approximately 150° C. is used to remove the SiN film 34, and then ion implantation is conducted to control the impurity concentration of the mesa type silicon 33a and the SOI substrate 30. Thereafter, as shown in FIG. 21, a gate oxide film 39 with a film thickness on the order of 8 nm is formed on the entire top surface of the SOI substrate 30 comprising the mesa type silicon film 33a with the oxide film 36a, and polysilicon 37 is overlaid thereon for formation of a gate electrode.

EXAMPLE 4

In the same manner as in Example 3, an oxide film 36a is formed on the top edge section of a mesa type silicon 13a, as shown in FIG. 16 through FIG. 20.

Figure 22:
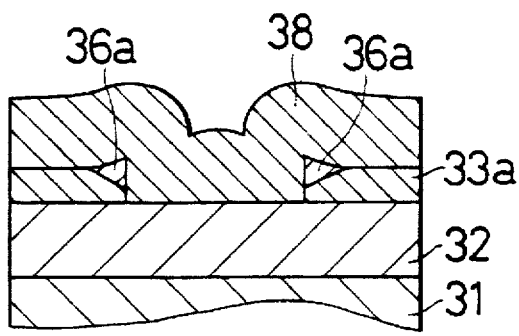
FIG. 22 is a schematic flow diagram illustrative of a fourth embodiment of the method for manufacturing a semiconductor device of the invention.

Then, as shown in FIG. 22, a SiN film 38 with a film thickness on the order of 100 nm is formed on the entire top surface of a SOI substrate 30 comprising the mesa type silicon 33a with the oxide film 36a.

Figure 23:
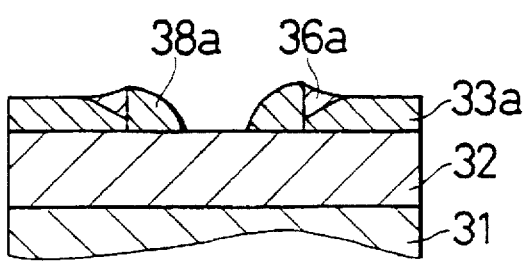
FIG. 23 is another schematic flow diagram illustrative of the fourth embodiment of the method for manufacturing a semiconductor device of the invention.

Subsequently, as shown in FIG. 23, by etching back the SiN film 38 by anisotropic dry etching there is formed a SiN spacer 38a on the section between the levels of the oxide film 36a formed on the top edge section of the mesa type silicon 33a and the top surface of the buried oxide film 32, that is, the sidewall of the mesa type silicon 33a. This formation may lessen the difference in level between the oxide film 36a and the buried oxide film 32, and allows elimination of difficulties encountered in processing of the gate electrode which are caused by the difference in level.

Figure 24:
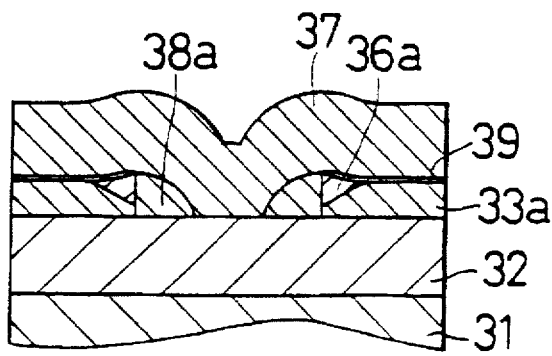
FIG. 24 is an additional schematic flow diagram illustrative of the fourth embodiment of the method for manufacturing a semiconductor device of the invention.

Thereafter, as shown in FIG. 24, a gate oxide film 39 is formed on the entire top surface of the SOI substrate 30 comprising the mesa type silicon 33a with the oxide film 36a and the spacer 38a, and polysilicon 37 is overlaid on the film 39 for formation of a gate electrode.

EXAMPLE 5

Figure 25:
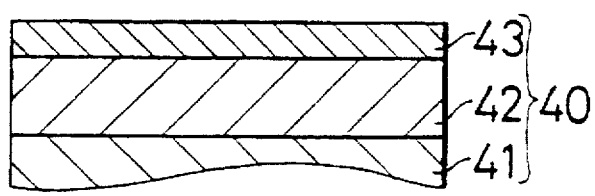
FIG. 25 is a first schematic flow diagram illustrative of a fifth embodiment of the method for manufacturing a semiconductor device of the invention.

As shown in FIG. 25, a SOI substrate 40 is used, which comprises a buried oxide film 42 with a film thickness on the order of 200 nm and a top silicon layer 43 with a film thickness on the order of 100 nm formed on a silicon plate 41.

Figure 26:
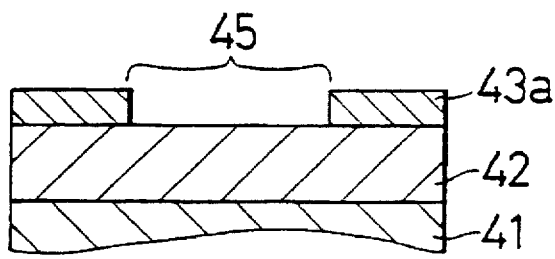

Then, as shown in FIG. 26, the entire part of the top silicon layer 43 in the region 15 which will be later converted into an element isolation region, is removed by photolithography and an anisotropic dry etching to expose the buried oxide film 42 in the region 45 and to form a mesa type silicon 43a.

Figure 27:
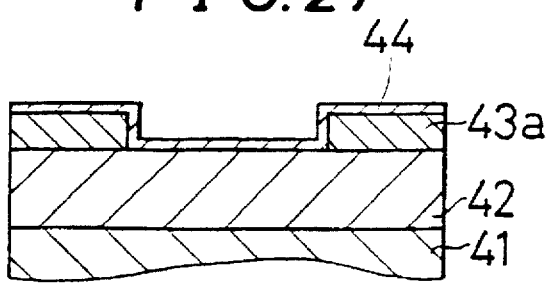
FIG. 27 is a third schematic flow diagram illustrative of the fifth embodiment of the method for manufacturing a semiconductor device of the invention.

Further, as shown in FIG. 27, a 5 nm thick CVD oxide film (not shown in the figure) and a SiN film 44 with a film thickness on the order of 40 nm are overlaid on the entire top surface of the SOI substrate 40.

Figure 28:
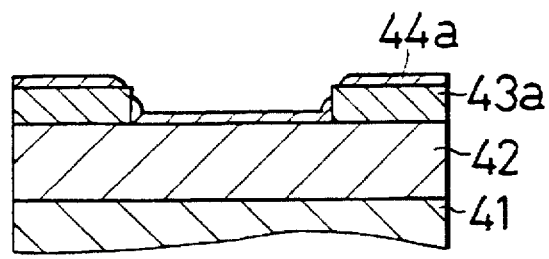
FIG. 28 is a fourth schematic flow diagram illustrative of the fifth embodiment of the method for manufacturing a semiconductor device of the invention.

Then, as shown in FIG. 28, the SiN film 44 on the top edge section of the mesa type silicon layer 43a is removed by anisotropic dry etching under conditions which produce a great sputtering effect. This etching is carried out with a stream of 30 SCCM of $C_3F_8$ as the etching gas in the etching chamber while controlling the pressure to 3 mTorr and setting the source power to 2.800 and the bias power to 600 W. Under these etching conditions, etching rate is maintained only for the angular configurations, whereas shapes with even surfaces cannot be etched.

Figure 29:
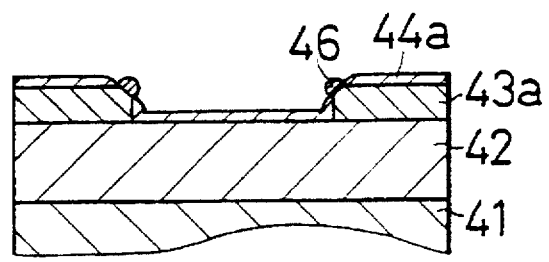
FIG. 29 is a fifth schematic flow diagram illustrative of the fifth embodiment of the method for manufacturing a semiconductor device of the invention.

Then, as shown in FIG. 29, the top edge section of the mesa type silicon 33a is provided with an oxide film 46 which has a maximum thickness of approximately 70 nm at its thickest section, under conditions which allow production of an oxide film with a thickness on the order of 100 nm on an even, bare silicon wafer by pyrogenic oxidation at around 900° C., with the residual SiN film 44a as the mask.

Figure 30:
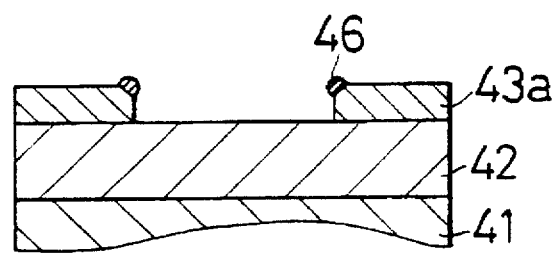
FIG. 30 is a sixth schematic flow diagram illustrative of the fifth embodiment of the method for manufacturing a semiconductor device of the invention.

Then, as shown in FIG. 30, phosphoric acid heated to approximately 150° C. is used to remove the SiN films 44a remaining on the mesa type silicon 43a and the buried oxide film 42. Subsequently, ion implantation is conducted to control the impurity concentration of the mesa type silicon 43a and the SOl substrate 40.

Figure 31:
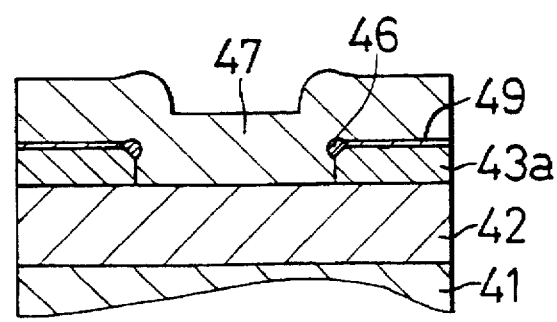
FIG. 31 is a seventh schematic flow diagram illustrative of the fifth embodiment of the method for manufacturing a semiconductor device of the invention.

Thereafter, as shown in FIG. 31, a gate oxide film 49 with a film thickness on the order of 8 nm is formed on the entire top surface of the SOI substrate 40 comprising the mesa type silicon 43a with the oxide film 46, and polysilicon 47 is overlaid on the film 49 for formation of a gate electrode.

EXAMPLE 6

In the same manner as in EXAMPLE 5 above, an oxide film 46 is formed on the top edge section of a mesa type silicon 43a covered with a SiN film 44a, as shown in FIG. 25 through FIG. 29.

Figure 32:
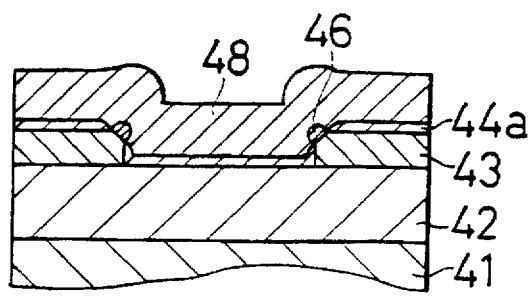
FIG. 32 is a schematic flow diagram illustrative of a sixth embodiment of the method for manufacturing a semiconductor device of the invention.

Then, as shown in FIG. 32, a SiN film 48 with a film thickness on the order of 100 nm is formed on the entire top surface of the SOl substrate 40 comprising the mesa type silicon 43a with the oxide film 46a, and the SiN film 44a.

Figure 33:
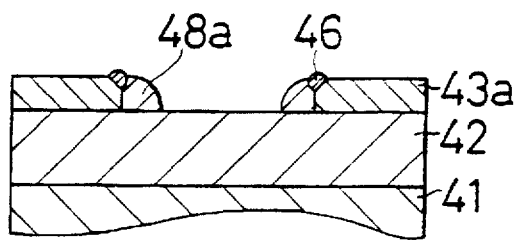
FIG. 33 is another schematic flow diagram illustrative of the sixth embodiment of the method for manufacturing a semiconductor device of the invention.

Subsequently, as shown in FIG. 33, by etching back the SiN film 48 by anisotropic dry etching there is formed a SiN spacer 48a on the section between the levels of the oxide film 46 formed on the top edge section of the mesa type silicon 43a and the top surface of the buried oxide film 42, that is, the sidewall of the mesa type silicon 43a. This formation may lessen the difference in level between the oxide film 46 and the buried oxide film 42, and allows elimination of difficulties encountered in processing of the gate electrode which are caused by the difference in level.

Figure 34:
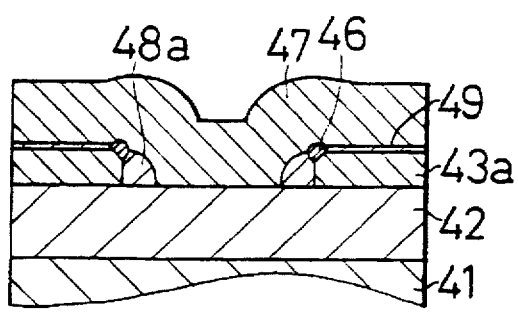
FIG. 34 is an additional schematic flow diagram illustrative of the sixth embodiment of the method for manufacturing a semiconductor device of the invention.
Figure 35:
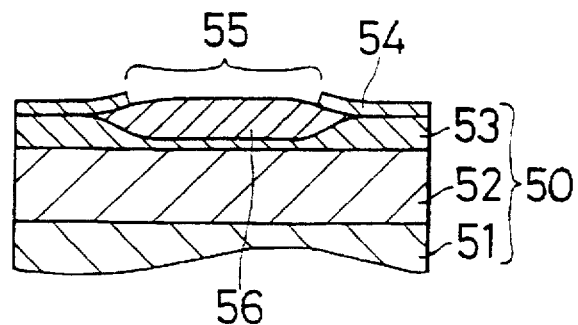
FIG. 35 is a first schematic flow diagram illustrative of a method for manufacturing a semiconductor device of the prior art.
Figure 36:
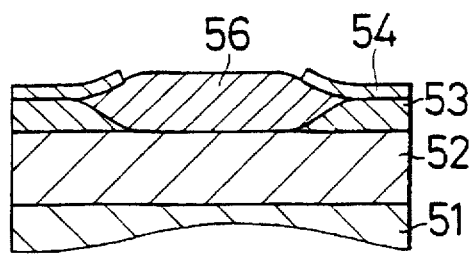
FIG. 36 is a second schematic flow diagram illustrative of the method for manufacturing a semiconductor device of the prior art.
Figure 37:
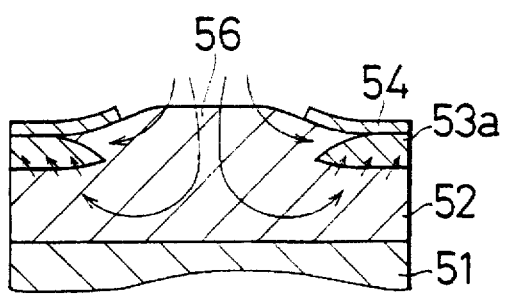
FIG. 37 is a third schematic flow diagram illustrative of the method for manufacturing a semiconductor device of the prior art.
Figure 38:
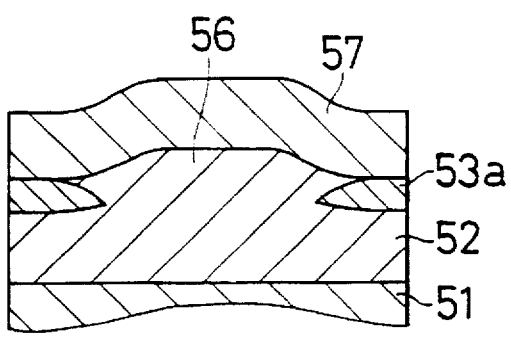
FIG. 38 is a fourth schematic flow diagram illustrative of the prior art method for manufacturing a semiconductor device.
Figure 39:
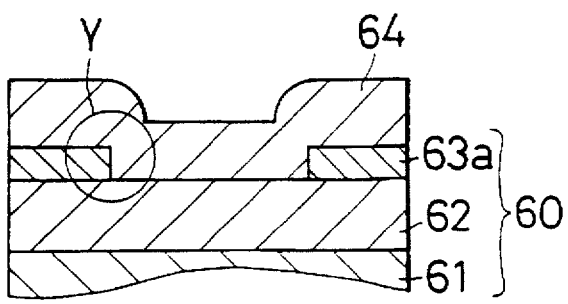
FIG. 39 is a schematic section view of the main portion of another semiconductor device of the prior art.
Figure 40:
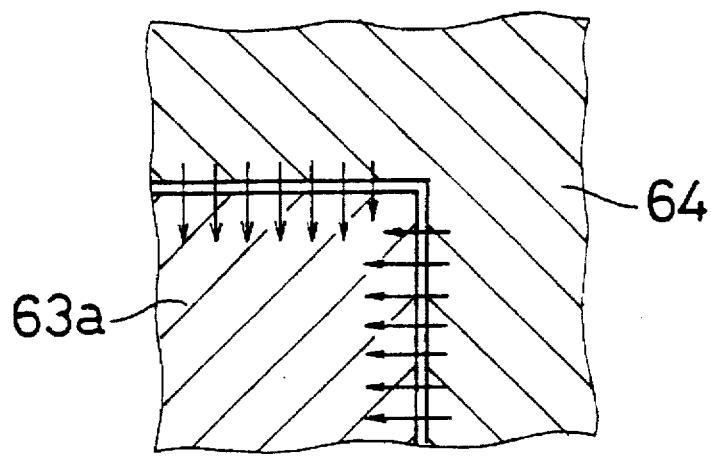
FIG. 40 is an enlarged view of the Y section shown in FIG. 39.
Figure 41:
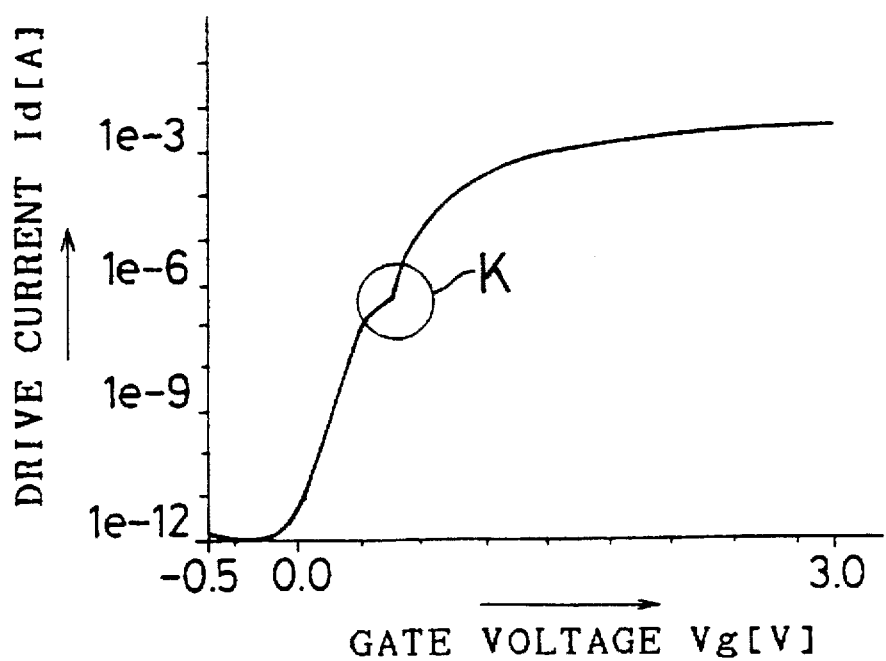
FIG. 41 is a graph showing the drive current-gate voltage characteristics of the semiconductor device shown in FIG. 39.
Figure 42:
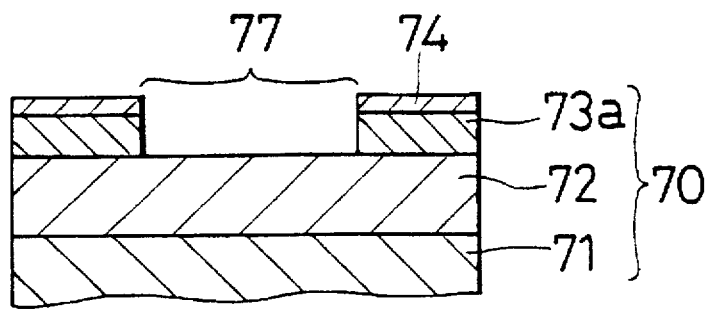
FIG. 42 is a first schematic flow diagram illustrative of another prior art method for manufacturing a semiconductor device.
Figure 43:
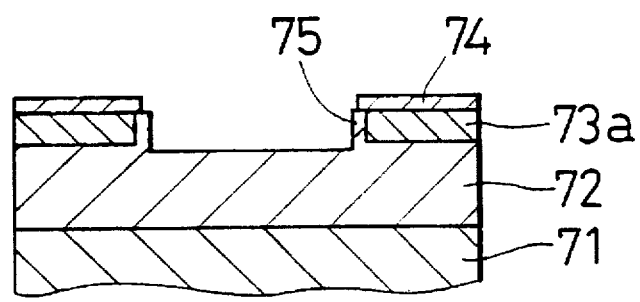
FIG. 43 is a second schematic flow diagram illustrative of the other prior art method for manufacturing a semiconductor device.
Figure 44:
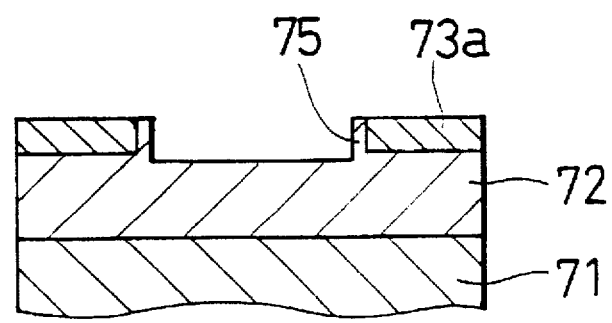
FIG. 44 is a third schematic flow diagram illustrative of the other prior art method for manufacturing a semiconductor device.
Figure 45:
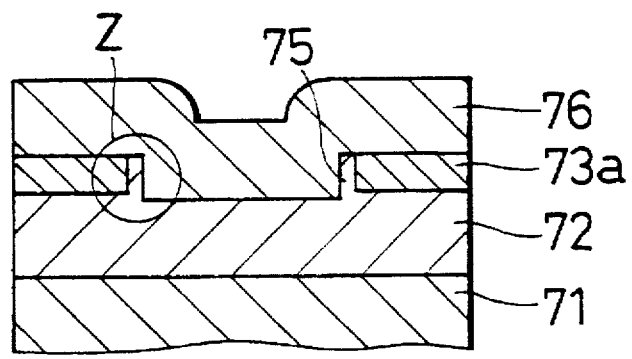
FIG. 45 is a fourth schematic flow diagram illustrative of the other prior art method for manufacturing a semiconductor device.
Figure 46:
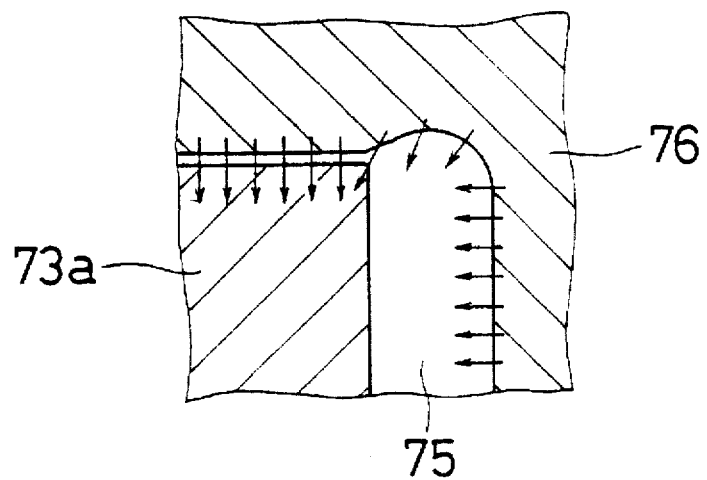
FIG. 46 is an enlarged view of the Z section shown in FIG. 39.
Figure 47:
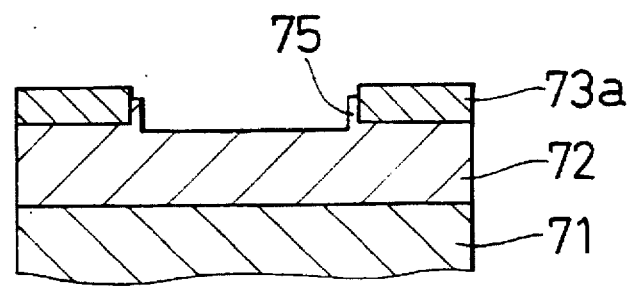
FIG. 47 is a schematic flow diagram illustrative of an additional prior art method for manufacturing a semiconductor device.
Figure 48:
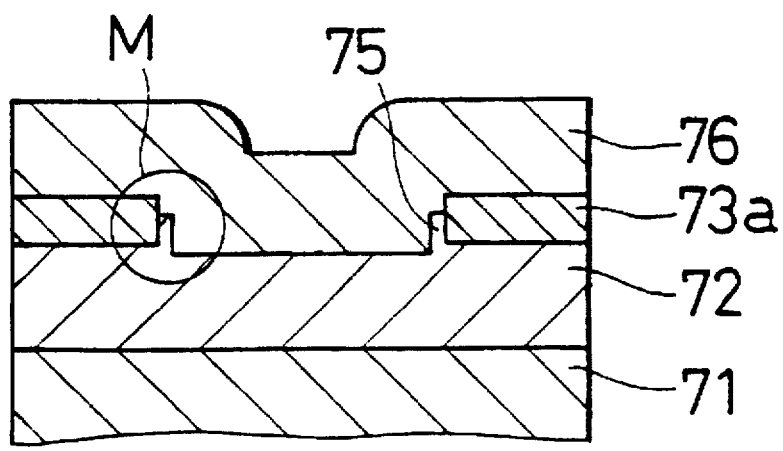
FIG. 48 is another schematic flow diagram illustrative of the additional prior art method for manufacturing a semiconductor device.
Figure 49:
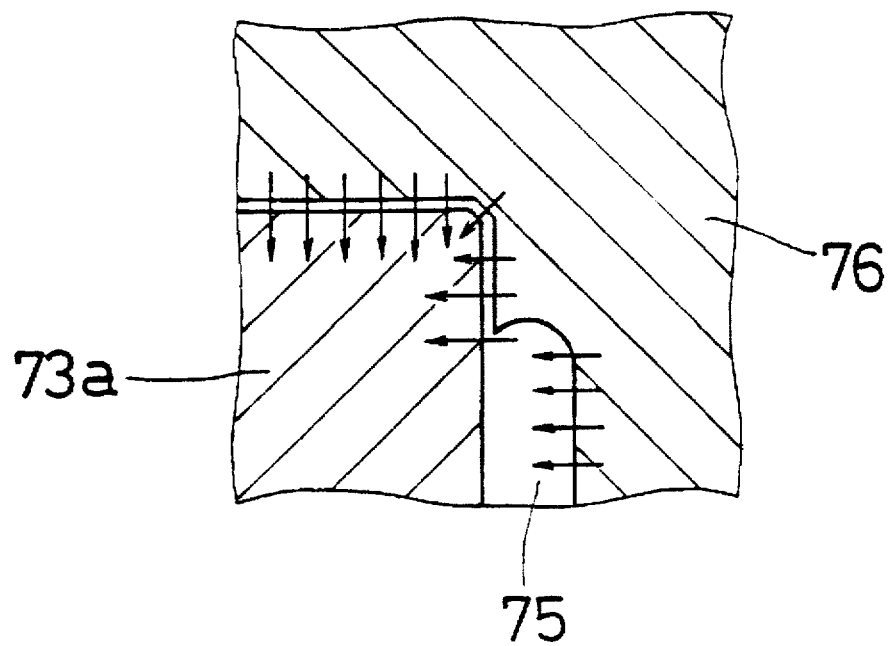
FIG. 49 is an enlarged view of the M section shown in FIG. 48.

Thereafter, as shown in FIG. 34, a gate oxide film 49 is formed on the entire top surface of the SOI substrate 40 comprising the mesa type silicon 43a with the oxide film 46 and the spacer 48a, and polysilicon 47 is overlaid on the film 49 for formation of a gate electrode.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed:

1. A semiconductor device comprising:

a mesa type silicon film with a source/drain region and a channel region formed therein;

a gate oxide film formed on the mesa type silicon film; and a gate electrode provided on the mesa type silicon film through the gate oxide film, wherein an oxide film having a thickness greater than that of the gate oxide film is formed only on the top edge section of the mesa type silicon film which is present under the gate electrode.

2. The semiconductor device according to claim 1, wherein the mesa type silicon film has a spacer formed along each sidewall which is present under the gate electrode.

3. A semiconductor device as in claim 2 wherein each spacer is formed of silicon nitride.

4. A semiconductor device as in claim 1 wherein the oxide film having a thickness greater than the gate oxide film is formed in the shape of a bird's beak.

5. A semiconductor device as in claim 2 wherein the oxide film having a thickness greater than the gate oxide film is formed in the shape of a bird's beak.

6. A semiconductor device as in claim 1 wherein the oxide having a thickness greater than the gate oxide film has a maximum thickness of 5 to 300 nm.

7. A semiconductor device as in claim 1 wherein the mesa type silicon film is formed on an insulating substrate.

* * * * *